(12) United States Patent
Hellberg

(10) Patent No.: US 8,593,225 B2
(45) Date of Patent: *Nov. 26, 2013

(54) HYBRID CLASS AMPLIFIER

(71) Applicant: Telefonaktiebolaget L M Ericsson (publ), Stockholm (SE)

(72) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 13/712,513

(22) Filed: Dec. 12, 2012

(65) Prior Publication Data

US 2013/0106520 A1 May 2, 2013

Related U.S. Application Data

(63) Continuation of application No. 13/061,453, filed as application No. PCT/SE2008/050979 on Sep. 1, 2008, now Pat. No. 8,350,627.

(51) Int. Cl.
*H03F 3/04* (2006.01)

(52) U.S. Cl.
USPC .......................... 330/302; 330/305; 330/277

(58) Field of Classification Search
USPC .......................................... 330/302, 277, 305
See application file for complete search history.

(56) References Cited

U.S. PATENT DOCUMENTS

| | | | |
|---|---|---|---|
| 8,131,251 B2 * | 3/2012 | Burgener et al. | 455/333 |
| 2006/0270367 A1 | 11/2006 | Burgener et al. | |
| 2012/0252384 A1 * | 10/2012 | Burgener et al. | 455/127.1 |

FOREIGN PATENT DOCUMENTS

JP 2005-080114 3/2005

OTHER PUBLICATIONS

Deltimple et al., "A SiGe Controlled-Class Power Amplifier Applied to Reconfigurable Mobile Systems" IXL Laboratory, NCRS UMR 5818, CNRS FR 2648, ENSEIRB—University of Bordeaux 1, 2005 European Microwave Conference, vol. 1, Oct. 4-6, 2005, pp. 457-460.

Hong et al., "High Efficiency GaN HEMT Power Amplifier Optimized for OFDM EER Transmitter" IEEE MTT-S International Microwave Symposium 2007, Jun. 2007, pp. 1247-1250.

Kang et al. "A Highly Efficient and Linear Class-AB/F Power Amplifier for Multimode Operation" IEEE Transactions on Microwave Theory and Technique, vol. 56 No. 1, Jan. 2008, pp. 77-87.

Frederick H. Raab, "Class-E, Class-C and Class-F Power Amplifiers Based Upon a Finite Number of Harmonics" IEEE Transactions on Microwave Theory and Techniques, vol. 49, No. 8, Aug. 8, 2001, pp. 1462-1468.

International Search Report, PCT/SE2008/050979, May 6, 2009.
Written Opinion of the International Searching Authority, PCT/SE2008/050979, May 6, 2009.
International Preliminary Report on Patentability, PCT/SE2008/050979, Nov. 30, 2010.

* cited by examiner

*Primary Examiner* — Hieu Nguyen
(74) *Attorney, Agent, or Firm* — Myers Bigel Sibley & Sajovec

(57) ABSTRACT

A power amplifier is configured to generate impedances at harmonic frequencies such that the power amplifier operates in a class C mode in a low output amplitude range and in a class F or inverse F mode in a high output amplitude range. Related methods of operation are also discussed.

25 Claims, 16 Drawing Sheets

GENERATING AN IMPEDANCE AT HARMONIC FREQUENCIES SUCH THAT THE AMPLIFIER OPERATES IN A CLASS C MODE IN A LOW OUTPUT AMPLITUDE RANGE AND IN A CLASS F OR INVERSE CLASS F MODE IN A HIGH OUTPUT AMPLITUDE RANGE — 160

FIG. 16

HYBRID CLASS AMPLIFIER

CROSS-REFERENCE TO RELATED APPLICATIONS

This application is a continuation of U.S. patent application Ser. No. 13/061,453, filed Feb. 28, 2011, which is a 35 U.S.C. §371 national phase application of PCT Patent Application No. PCT/SE2008/050979, filed Sep. 1, 2008, entitled Hybrid Class Amplifier, assigned to the assignee of the present application, the disclosures of which are hereby incorporated herein by reference as if set forth in their entireties herein.

TECHNICAL FIELD

The present invention generally relates to an amplifier capable of operating in different class modes and, more particularly, to mechanisms and techniques for configuring an amplifier to have selected features of a class C amplifier and selected features of a class F or inverse class F amplifier.

BACKGROUND

The rapid growth of mobile telecommunications services has created increasing demand for low-cost, low-power and reduced size and weight equipment. One such equipment is found in the transmitters in base stations and terminals for mobile telephony, as well as transmitters for broadcast and other wireless systems. The transmitters employ power amplifiers to amplify a radio frequency (RF) signal to the antenna. Often, the power amplifier needs to be highly efficient, to not overheat, require excessive cooling or draw less power to increase battery time and decrease the cost of power.

One aspect of amplifier efficiency is related to the current and voltage waveforms used by the power amplifier. More specifically, the amplifier efficiency is related to an amount of simultaneous voltage drop over, and current through, a transistor that is part of the power amplifier. A reduction in the voltage drop and current through the transistor results in a reduction in the used power. The reduction in voltage drop and the current through the transistor are indicated by the waveforms of the current and voltage at the transistor. The optimal waveforms for high (maximum) output power are different from the waveforms at low output powers (relative maximum output), and the traditional circuits used for obtaining those waveforms are mutually exclusive. For a better understanding of the exemplary embodiments, the state of the art of power amplifiers is discussed next.

Traditionally, power amplifiers are categorized into different classes according to their linearity and the waveforms for current and voltage. The two major classes of power amplifiers are linear and non-linear power amplifiers. Classes A, AB, B and C correspond to linear power amplifiers while classes D and F correspond to non-linear power amplifiers. In this regard, FIG. 1A shows the output of a linear power amplifier and FIG. 1B shows the output of a non-linear power amplifier. The axes of FIGS. 1A and B use arbitrary units. Classes A, AB, B, C, D and F are discussed next in more detail. Each class is characterized by circuit properties (which are the same for some classes) and a bias applied to the transistor (which may be different between some classes).

A class A power amplifier is defined as an amplifier that is biased so that the output current flows all the time, as shown in FIG. 2, and the input signal drive level is kept small enough to avoid driving the transistor in the cut-off region. In other words, a conduction angle of the transistor is 360°, meaning that the transistor conducts for the full cycle of the input signal. This property makes the class A power amplifier the most linear of all the amplifier types.

A class B power amplifier is an amplifier in which the conduction angle for the transistor is approximately 180°, as shown in FIG. 3. In this class, the current waveform is a half-wave rectified sinewave and the voltage is confined by a parallel resonant tank circuit to be a sine offset by the supply voltage. Ideal transistors for class B operation have constant transconductance above cut-off and the gate or base biased right at the cut-off. The direct current (DC) supply current is then directly proportional to the RF output current (i.e., to the fundamental harmonic component of the half-wave rectified sine). The sinusoidal RF output voltage is also proportional to the RF output current (for the common linear load resistance). This in turn makes the efficiency of the power amplifier proportional to the output signal's amplitude.

The efficiency of the constant supply voltage class B amplifier is proportional to the output voltage, up to a maximum of 78.5% for ideal devices in a lossless circuit. The average efficiency for a class B amplifier, outputting a signal whose average signal level is low compared to the maximum (peak) level, i.e., that has a high peak-to-average ratio, is therefore low compared to the efficiency at a maximum output.

Some transistors (hereinafter called "quasi-linear") do not have constant transconductance above cut-off, but can be seen as having a first substantially linear part followed by a substantially constant part (above which it usually drops off again). In this case, the best linearity is obtained by so called class AB bias, shown in FIG. 4. A constant (DC) bias voltage applied to the gate or base is chosen as the point on the transconductance slope around which the transconductance is maximally (odd) symmetric. In the simplified model shown in FIG. 4, this point is exactly in the middle of the linear slope part of the transconductance curve.

Since the gate bias for class AB is in the middle of the transconductance slope, the transistor draws current even if no RF signal is present. Thus, the efficiency of the power amplifier is therefore lower (especially for low signal amplitudes) for a class AB amplifier than for a class B amplifier described in FIG. 3. The current pulses of the class AB power amplifier are similar to the half-wave rectified sinewave pulses of class B but complemented with "tails" on each side.

When biasing a quasilinear transistor so that the transistor draws no DC current when no RF signal is present, the output response is nonlinear with respect to the input. The efficiency is thus better than for the ideal class B amplifier, but the maximum output is lower (for otherwise equal conditions). The current waveform consists of narrower pulses than for ideal class B or AB power amplifiers, which indicates a greater content of higher harmonics.

For most transistors, for example those with constant transconductance or quasi-linear transconductance, decreasing the bias below the cut-off voltage gives even narrower current pulses, lower gain, better efficiency, and further reduced maximum output power. This mode of operation defines the class C power amplifier. The class C power amplifier is an amplifier in which the conduction angle for the transistor may be less than 180° and the characteristic output of this amplifier is shown in FIG. 5. Alternatively, the class C power amplifier is characterized by having narrow output current pulses at a transistor of the power amplifier.

By increasing the gate bias above class AB, to the point that the current is continuously drawn even at high amplitudes, a class A power amplifier is obtained. This class, as discussed above, has low efficiency for small signals, since the DC supply current drawn is high and largely independent of the signal level. The class A power amplifiers are used, inspite of the low efficiency, because they have a higher gain than other classes, which makes it possible to reach a maximum output with a small drive amplifier. For quasilinear transistors, the maximum RF output current of class A amplifiers may be larger than for class B or AB power amplifiers, for the same limitation in instantaneous drain (collector or, more generally, the active device's output node) current. By correspondingly decreasing the load resistance (as seen by the transistor) the maximum output power can be increased.

The abovementioned classes of operation may be obtained by a same circuit, which is characterized by a RF tank (parallel resonator at the fundamental frequency in parallel with the load). The RF tank is necessary because in coupling a tuned RF power amplifier to its load (the antenna or antenna feed line), the correct load resistance, which will enable the amplifier to deliver its rated power, has to be present to the output of the power amplifier. The RF tank ensures that this condition is fulfilled by shorting the harmonics of the current waveform, thereby forcing the output voltage to be sinusoidal. Other functions of the output circuit are to provide the DC current to the transistor through the RF choke and to block the DC from the supply voltage from reaching the load. Since the circuits for the above classes are identical, the difference between these classes of operation lies in the difference in current waveforms, which is caused by different (DC) gate biases to the transistor.

Using a dynamic grid (gate, base) biasing technique to achieve a varying class C through class A operation in a power amplifier, to obtain modulation as well as high average efficiency and high output power, is described in F. E. Terman and F. A. Everest, "Dynamic-shift grid-bias modulation", Radio, no. 211, pp. 22-29,80-, July, 1936. Improvements to this scheme, to further increase the efficiency and linearity for multicarrier signals, are described in Swedish Patent, SE 200201908 by R. Hellberg.

Non-linear amplifiers include class D and class F amplifiers and these amplifiers will be discussed later in more detail. An increase in the maximum power and efficiency relative to the linear amplifiers may be achieved by the class F and inverse F type amplifiers. The class F and inverse F amplifiers are characterized by a square-shaped output voltage waveform at a transistor of the power amplifier. The effect of class F/inverse F is to obtain a more square-shaped voltage or current waveform as described in V. J. Tyler, "A new high efficiency high power amplifier", Marconi Review, vol. 21, no. 130, pp 96-109, Third Quarter 1958 and F. H. Raab, "Maximum efficiency and output of class-F power amplifiers", IEEE trans. MTT, vol. 49, no. 6, June 2001. Using a push-pull arrangement together with switching transistors to obtain the same results as in the class F amplifier is a class D amplifier, i.e., the waveforms are similar but not necessarily the amplifiers. A voltage-switching class D power amplifier corresponds to a class F power amplifier and a current-switching class D power amplifier corresponds to an inverse class F power amplifier.

If the transistor output of the power amplifier "sees" a high impedance (ideally an open circuit) at odd harmonic frequencies instead of short circuits at all harmonics, then a class F power amplifier is present. The high impedance for the odd harmonic frequencies may be obtained by inserting parallel resonators ("harmonic block") in series with the previously described harmonically shorted load (tank and load). Thus, the class F power amplifier may have a high impedance at odd harmonics (often only the third). Instead, if some even harmonics (often only the second) "see" a high impedance, then an inverse class F power amplifier is present. If more harmonics are to have the high impedance, more parallel resonators are inserted in series, while keeping the remaining harmonics shorted.

The thus flattened waveform has a higher fundamental (RF) amplitude than the peak voltage or current would otherwise allow. This is due to the odd (voltage or current) harmonics that are in antiphase with the fundamental (voltage or current) at its peak, thus suppressing the peak without reducing the fundamental (i.e., flattening the wave towards a more square-shaped form). The high harmonic impedance caused by the parallel resonators imply that even a small harmonic current due to the current pulse shape causes a large voltage. This process is self-regulating in the maximum amplitude region due to the instantaneous current reduction due to voltage saturation ("I-V curve behaviour").

The class BD amplifier uses linear class B operation at low and medium amplitudes, but increases the maximum output power by using current-switching class D. The class BD amplifier is described in F. H. Raab, "The class BD high-efficiency RF power amplifier", IEEE Journal of Solid-State Circuits, vol. SC-12, no. 3, June 1977. The class BD power amplifier does not use class C or dynamic gate biasing.

The above discussed classes of power amplifiers have their problems, i.e., either low efficiency or low output power. In other words, no traditional method or power amplifier combines the high efficiency of class C amplifier (through dynamic gate bias) at medium output amplitudes and the high maximum output power of class F or inverse F amplifier. What prevents a combination of the class C amplifier with a class F amplifier is the negative interaction between the narrow current pulses of class C (and with quasi-linear transistors even class B) operation with the high harmonic impedances required for class F or inverse F operation. This problem manifests itself as a large harmonic voltage (by one or several harmonics) in phase with the fundamental voltage, saturating the transistor already at very low output amplitudes. Thus, the efficiency of the power amplifier is, on average, not higher than linear class B efficiency, and the advantage of class C operation cannot be obtained.

Another problem associated with existing power amplifiers that try to operate a class F or inverse F amplifier in class C is that the high harmonic voltages combine to give high and low peak voltages, which are not self-regulated by the saturation (I-V) behaviour of the transistor. Depending on the transistor type, these high and low peaks may cause severe efficiency degradation, failure to reach the desired output power, or catastrophic breakdown. The current and voltage (arbitrary scale) of an RF cycle for a medium output amplitude is shown in FIG. 6.

FIG. 7 shows the maximum and minimum drain voltages versus amplitude for the power amplifier. This figure shows an amplitude sweep of a class F amplifier with dynamic class C excitation. There are large voltage overshoots (r) and undershoots (b) at all amplitudes except the extreme low and high.

Accordingly, it would be desirable to provide devices and methods for communication equipment that avoids the aforedescribed problems and drawbacks.

SUMMARY

According to an exemplary embodiment, there is a power amplifier configured to generate impedances at harmonic frequencies such that the power amplifier operates in a class C mode in a low output amplitude range and in a class F or inverse class F mode in a high output amplitude range.

According to another exemplary embodiment, there is a method for amplifying a signal in a power amplifier. The method includes generating impedances at harmonic frequencies such that the power amplifier operates in a class C mode in a low output amplitude range and in a class F or inverse class F mode in a high output amplitude range.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 16 is a flow chart illustrating a method for using an amplifier according to an exemplary embodiment.

DETAILED DESCRIPTION

Figure 1A:
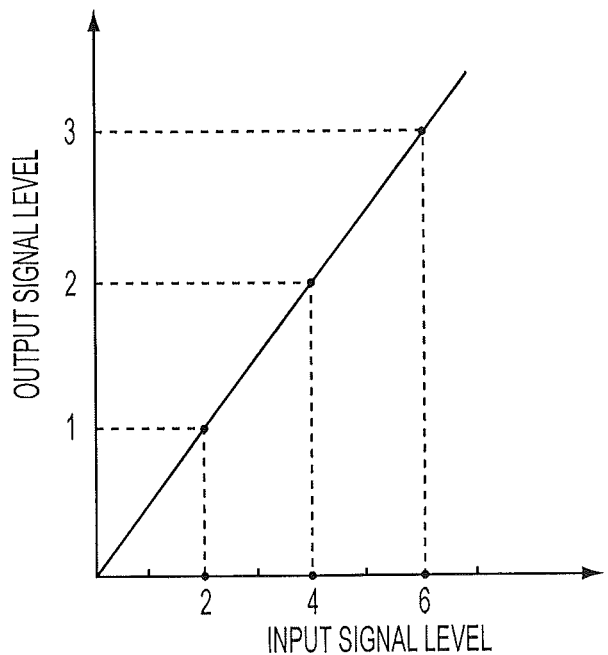
FIG. 1A is a graph showing an output of a linear power amplifier and FIG. 1B is a graph showing an output of a non-linear power amplifier.
Figure 1B:
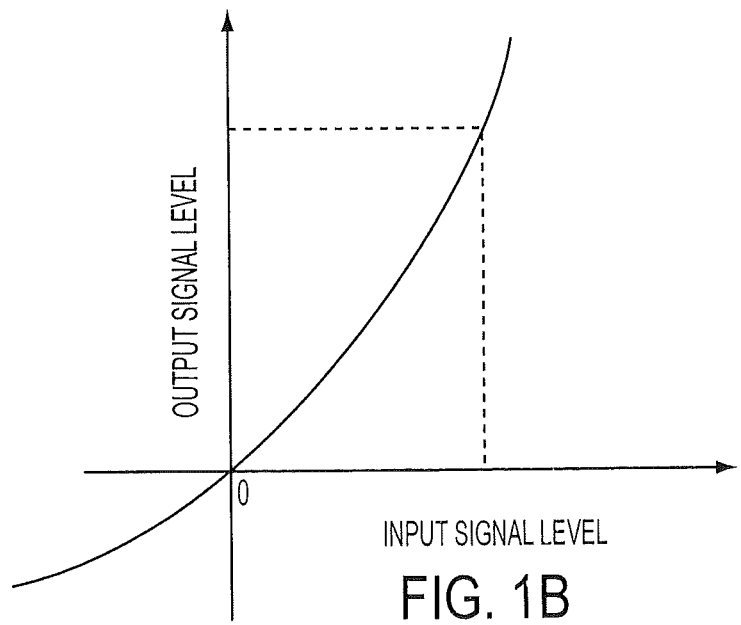
Figure 2:
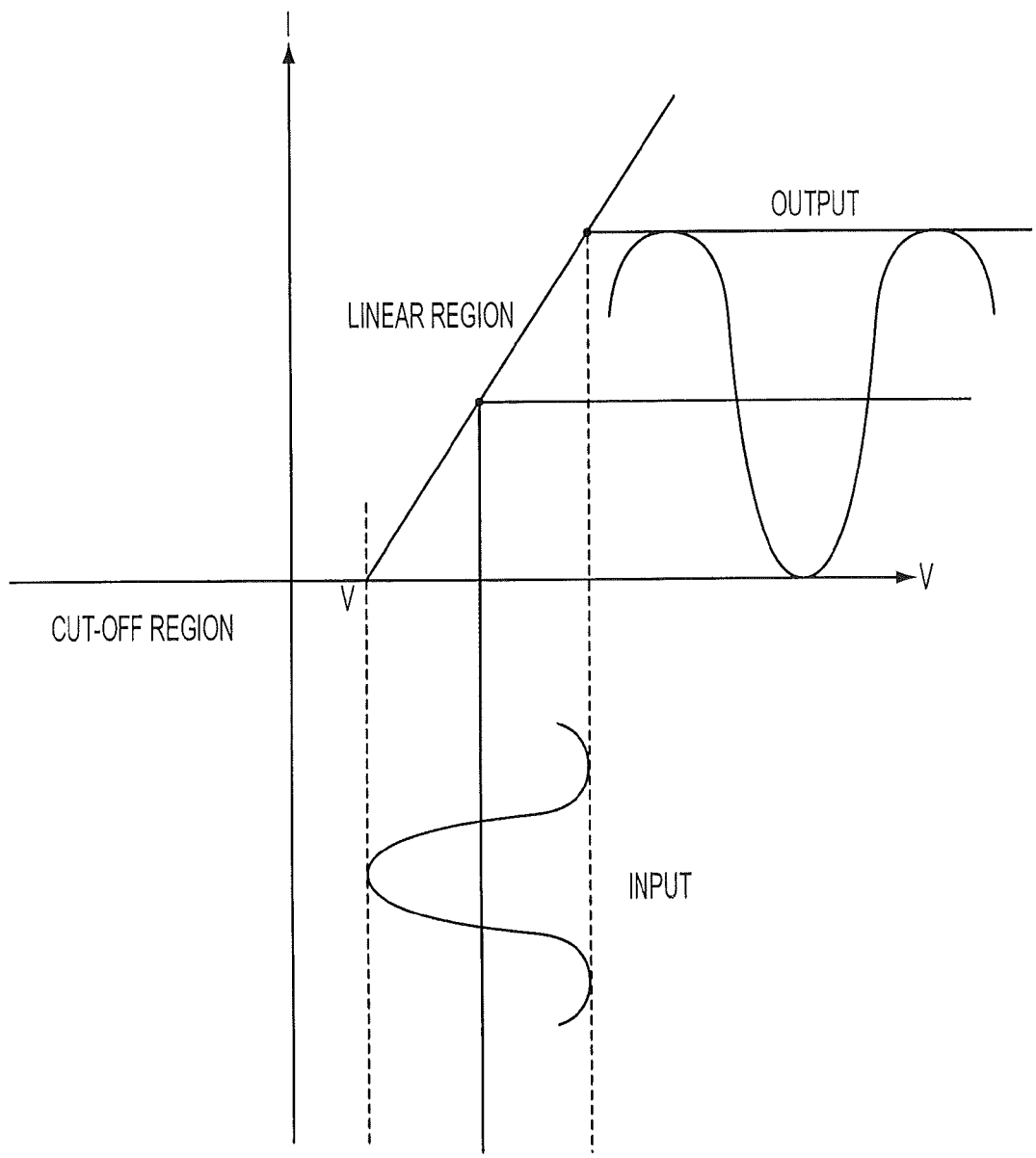
FIG. 2 is a graph showing the current-voltage characteristic for a class A amplifier.
Figure 3:
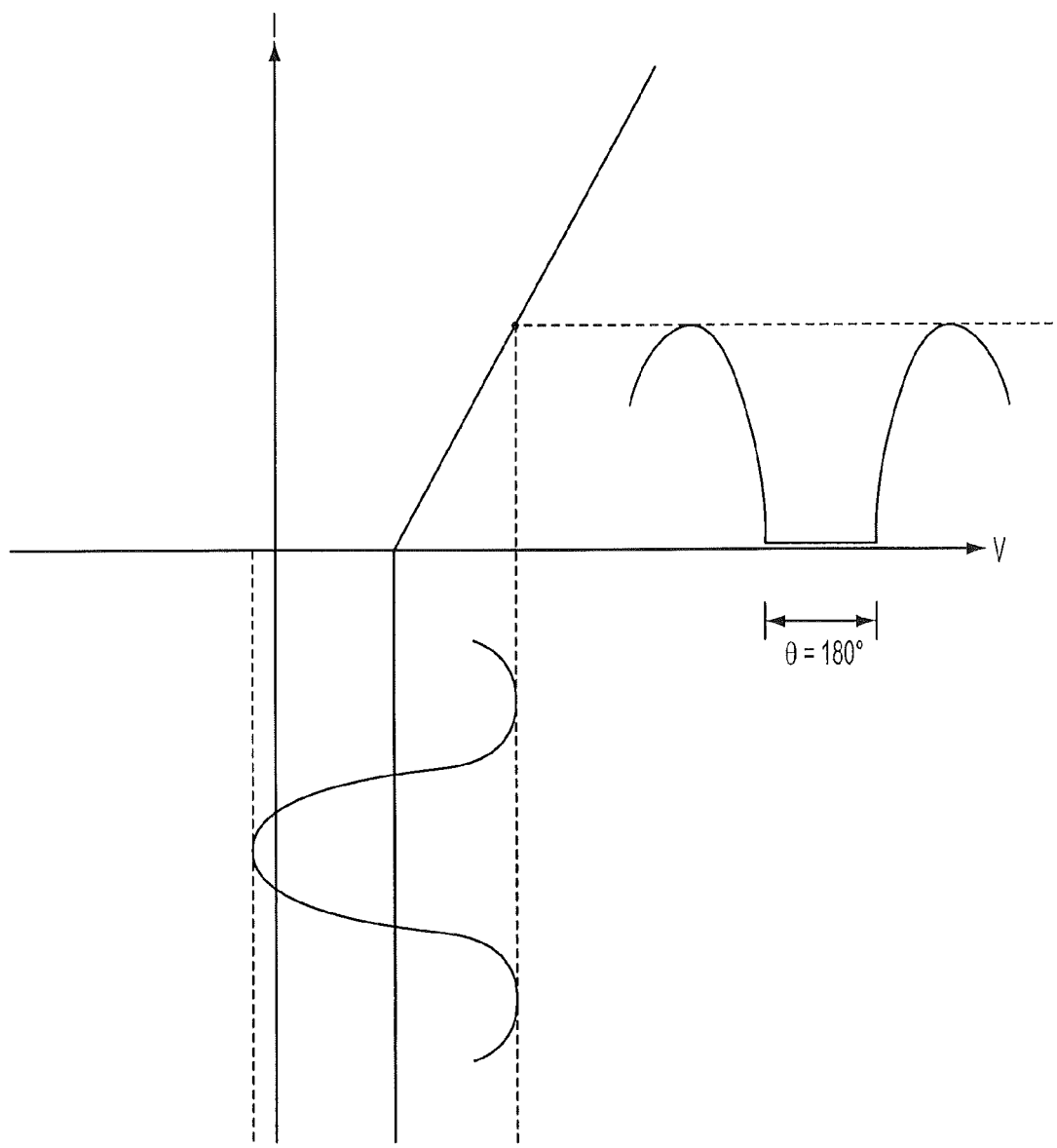
FIG. 3 is a graph showing the current-voltage characteristic for a class B amplifier.
Figure 4:
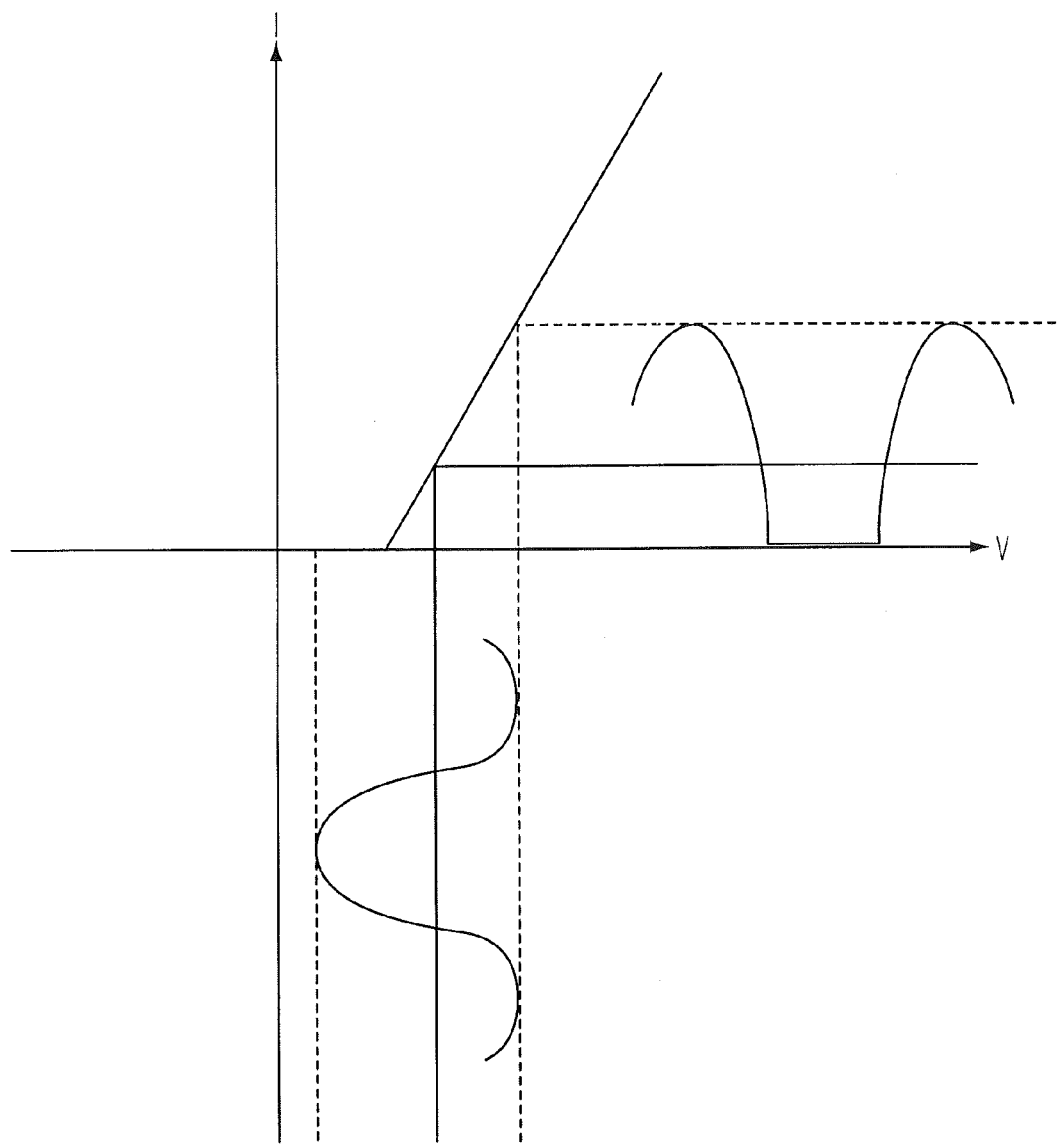
FIG. 4 is a graph showing the current-voltage characteristic for a class AB amplifier.
Figure 5:
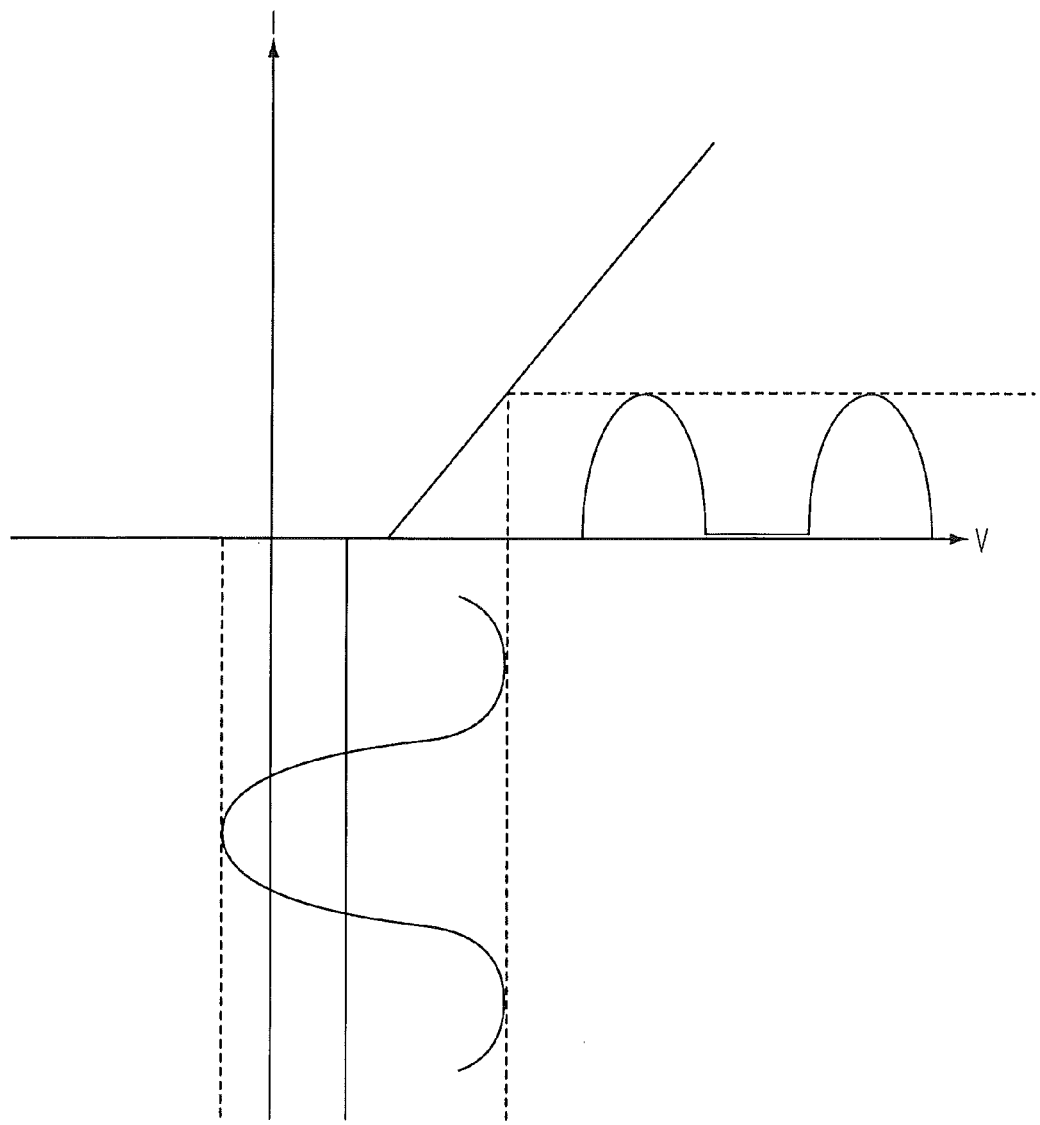
FIG. 5 is a graph showing the current-voltage characteristic for a class C amplifier.

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard a transistor having a corresponding output circuit. However, the embodiments to be discussed next are not limited to this system but may be applied to other systems.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

It is desirable to provide a power amplifier that combines selected class F features with selected class C features to overcome the problems discussed above with reference to the traditional power amplifiers. Such a novel amplifier may include smaller (and therefore cheaper) transistors to be used for the same maximum output power and may have a higher average efficiency for signals with a high peak to average ratio, due to the increase in the maximum output power for a given transistor. This novel configuration may move the high efficiency region of class C operation towards lower amplitudes (where the typical multicarrier signal is most of the time present). In addition to solving these two problems of the traditional amplifiers according to an exemplary embodiment, a novel amplifier according to another exemplary embodiment may increase the output power above that of a class F power amplifier while retaining the high average efficiency associated with the class F power amplifier. The novel power amplifiers discussed in the following exemplary embodiments are applicable to, for example, linear transmitters for multi-carrier/multi-user radio signals (Code Division Multiple Access (CDMA), Orthogonal Frequency-Division Multiplexing (OFDM), and Frequency Division Multiple Access (FDMA)).

For clarification, the term "narrow current pulses" may be used in some exemplary embodiments to define a class C amplifier. The class C amplifier, which is know in the literature and well defined, includes a definition of the underlying circuit, which is not compatible with applying narrow pulses to a modified class F circuit. Thus, the term "narrow current pulses" is used, according to an exemplary embodiment, to define current pulses that are narrower than what a regular class F amplifier would handle. In addition, the term "narrow current pulses" does not include a specific circuit. However, this definition is not a general definition but may vary from case to case, for example from transistor to transistor.

By introducing a resistance or an impedance that is seen, at the harmonic frequency or frequencies, by the transistor as relatively close in magnitude to the (transformed) load instead of having a high impedance as in a class F power amplifier, the novel power amplifier retains both the capability of high output power and the increased efficiency of (variable) class C operation at medium output amplitudes. The harmonic resistance degrades the efficiency at the highest output amplitudes, but not at low and medium amplitudes. For general multi-carrier/multiuser radio signals (CDMA, OFDM, FDMA), this is often not a problem, because the signals in these systems are rarely in the maximum amplitude region.

Figure 8:
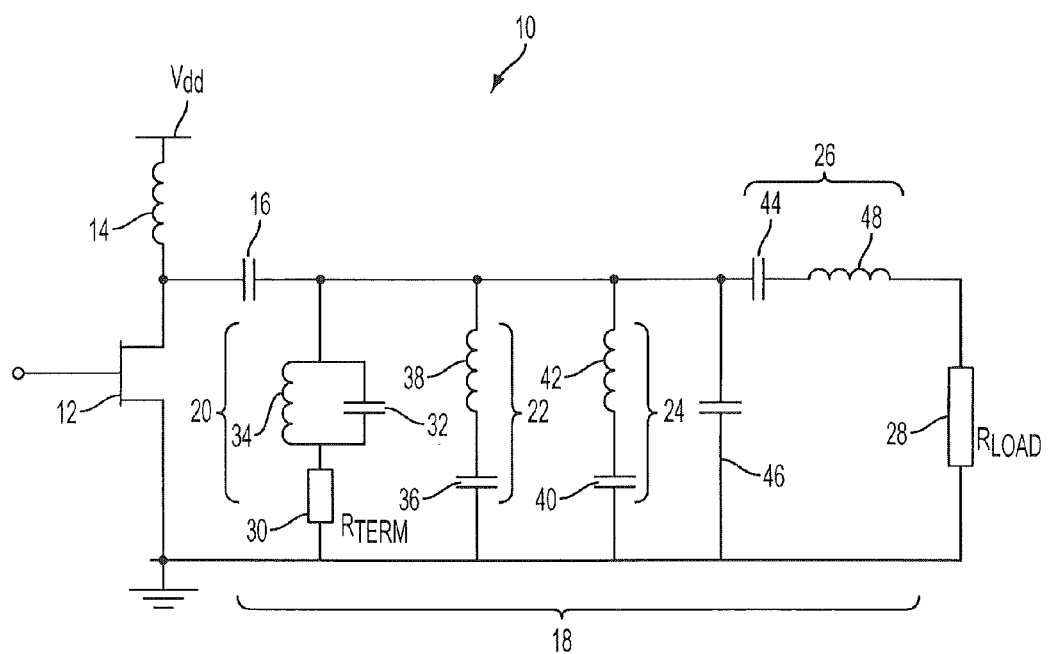
FIG. 8 is a schematic diagram of an amplifier according to an exemplary embodiment.

As shown in FIG. 8, according to an exemplary embodiment, a power amplifier 10 may include a transistor 12 (drive signal and dynamic gate bias circuitry omitted) having a supply voltage Vdd fed through an RF choke (inductor) 14, a DC blocking capacitor 16 that blocks a direct current component from reaching a load, and an output circuit 18 that has specific impedances for different harmonic overtones, as will be discussed next.

According to an exemplary embodiment, the output circuit 18 blocks the harmonics produced by the transistor 12, by using at least one parallel resonator 20 and one or more series resonators 22, 24 and 26, from reaching a load 28. The series resonators 22 and 24 provide short circuits at overtone frequencies 2×fc and 4×fc (where fc is the fundamental frequency). The interaction between the parallel coupled series resonators 22 and 24 produces high impedance values for the odd harmonics, for example for the third harmonic. The impedance at the odd harmonics is reduced by the resistor 30, which is marked "$R_{Term}$." The resistor 30 is blocked at the fundamental frequency fc by the parallel resonator 20. According to one exemplary embodiment, the resistor 30, has a value close to that of the resistance of the resistor 28, which is marked "$R_{Load}$" at odd frequencies. The more overtones included in the system the better. However, the exemplary embodiments work even when, for example, only the third harmonic is included. The impedance may also be different for different (odd) overtones, for example decreasing with frequency. A capacitor 44 may be added in parallel with the series resonators 22, 24, and 26 to act as a short circuit at infinity to terminate higher harmonics and to cause another odd harmonic resonance.

In one exemplary embodiment, the parallel resonator 20 may include a resistor 30. The resistor 30 may be connected in series with a capacitor 32 and an inductor 34, where the capacitor 32 and the inductor 34 are connected in parallel. In another exemplary embodiment, the series resonator 22 may include a capacitor 36 connected in series with an inductor 38. Still in another exemplary embodiment, the series resonator 24 may include a capacitor 40 connected in series with an inductor 42. In another exemplary embodiment, the series resonator 26 may include a capacitor 44 connected in series to the inductor 48. The capacitances and inductances for the above discussed parallel and series resonators depend on the characteristics of the transistor and other elements used in the power amplifier. In one exemplary embodiment, the series resonators 22 and 24 are connected together with the parallel resonator 20 in parallel between an emitter and a collector of the transistor 12 while the series resonator 26 may be connected between the emitter of the transistor 10 and the $R_{Load}$ 28.

In one exemplary embodiment, the output circuit 18 may include only the resistor $R_{Term}$, one series resonator 22 or 24 and the capacitor 46. This arrangement provides a resistive third harmonic and shorted second and fourth to infinity frequencies. For more odd harmonics, more series resonators (for different even harmonics) may be inserted. A similar behaviour may be obtained by an infinite number of circuits. For example, "microwave circuit" techniques (i.e., distributed elements, lines, etc.) may be used. Other ways to build class F amplifiers may be used if complemented with resistive termination that is seen only at the harmonics, i.e., isolated from the rest of the circuit at the fundamental frequency.

Figure 9:
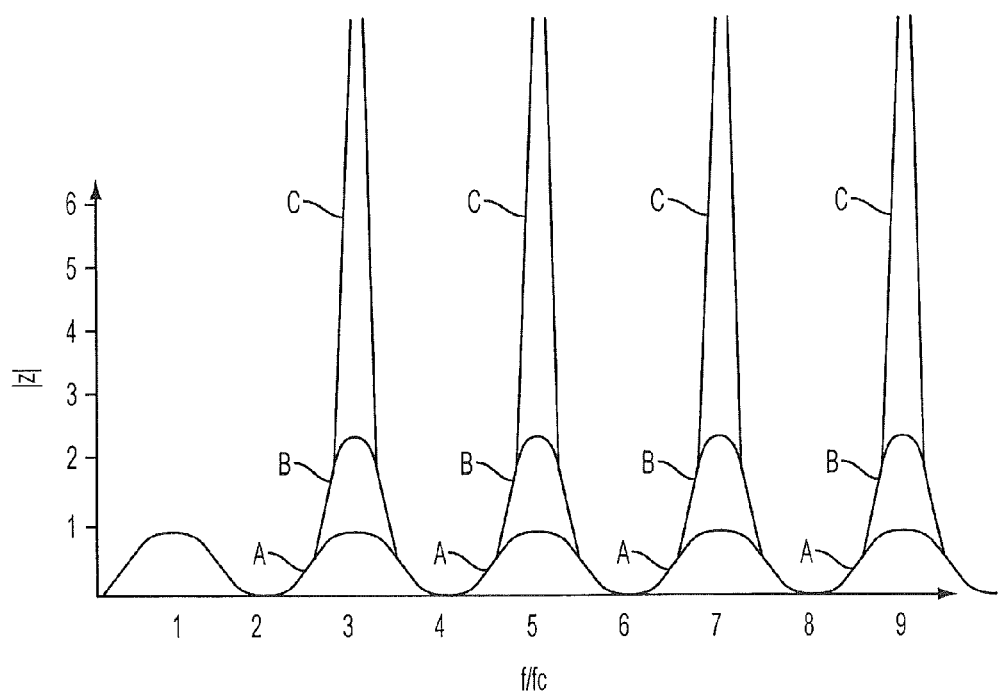
FIG. 9 is a graph showing the impedance of an amplifier according to two exemplary embodiments and the impedance of a class F amplifier.

FIG. 9 shows the impedance frequency response "A" as seen by the transistor output (drain) for the exemplary circuit shown in FIG. 8, the impedance frequency response "B" for using the circuit of FIG. 8 with a larger $R_{term}$, and the impedance frequency response "C" for a reference class F amplifier. The frequency response "C" of the reference class F amplifier is much larger than the frequency responses "A" and "B" of the exemplary embodiments.

Figure 6:
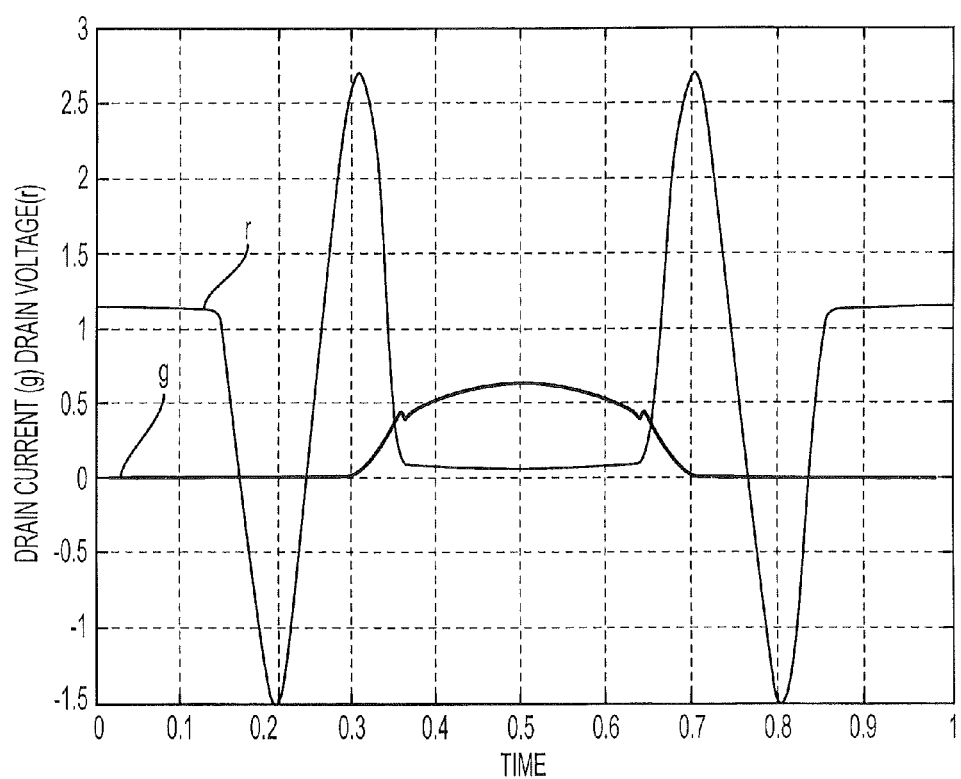
FIG. 6 is a graph illustrating one RF cycle of a class F amplifier with narrow (less than 50% duty cycle) current pulses (g) and large voltage (r) overshoots and undershoots.
Figure 7:
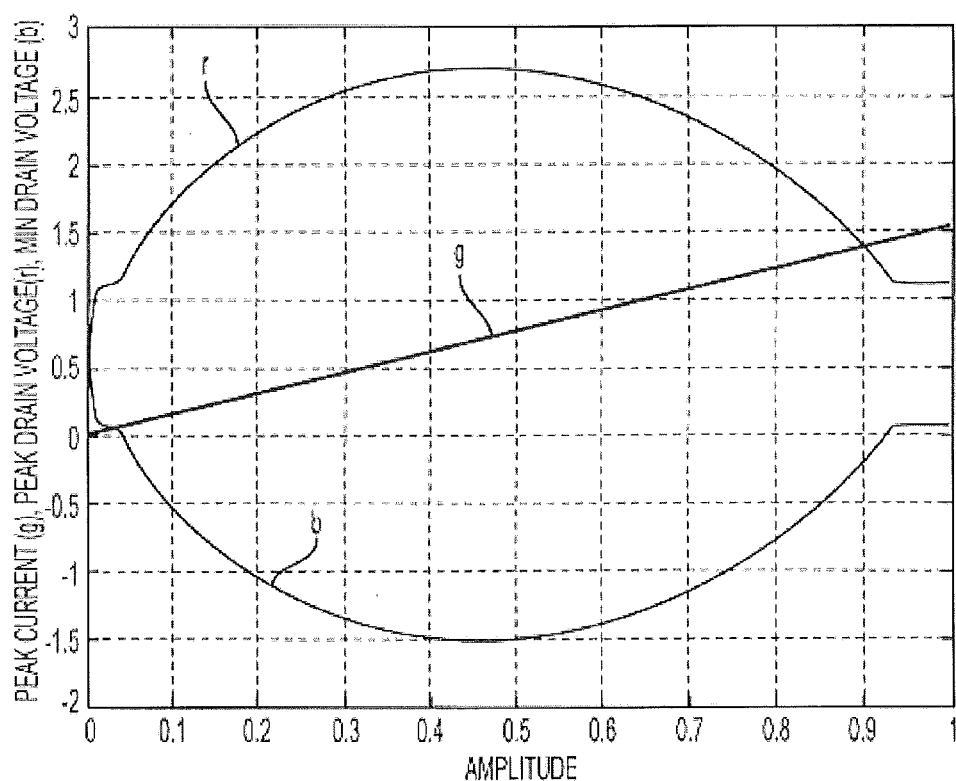
FIG. 7 is a graph showing maximum and minimum drain voltages versus amplitude of the class F amplifier of FIG. 6.
Figure 10:
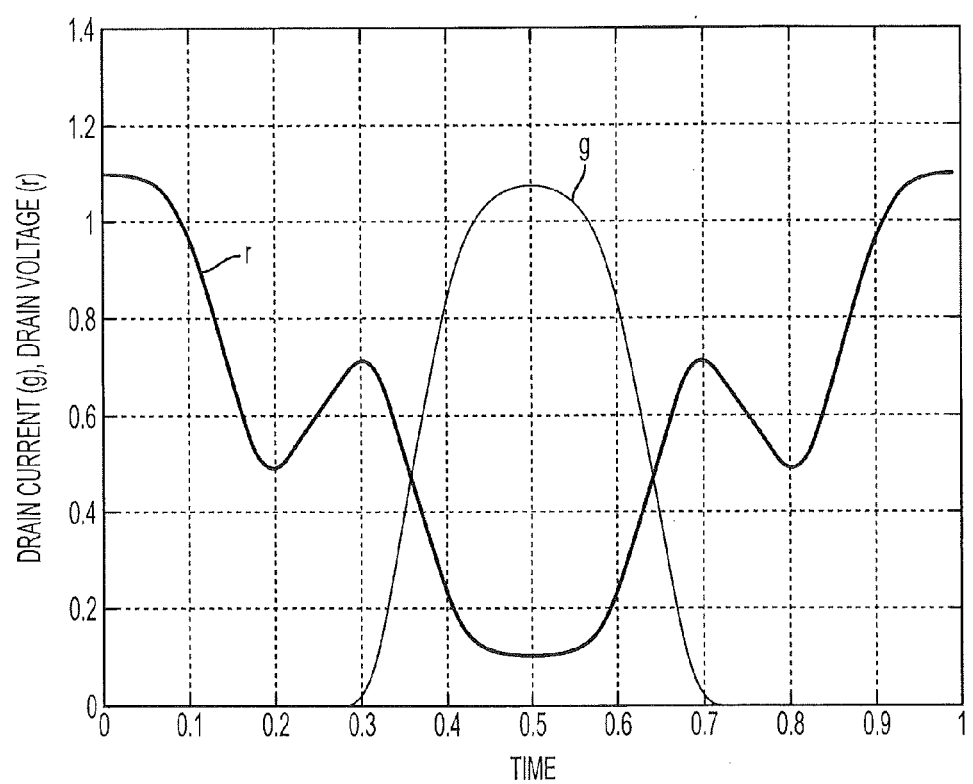
FIG. 10 is a graph showing improved overshoots voltages of an amplifier according to an exemplary embodiment.
Figure 11:
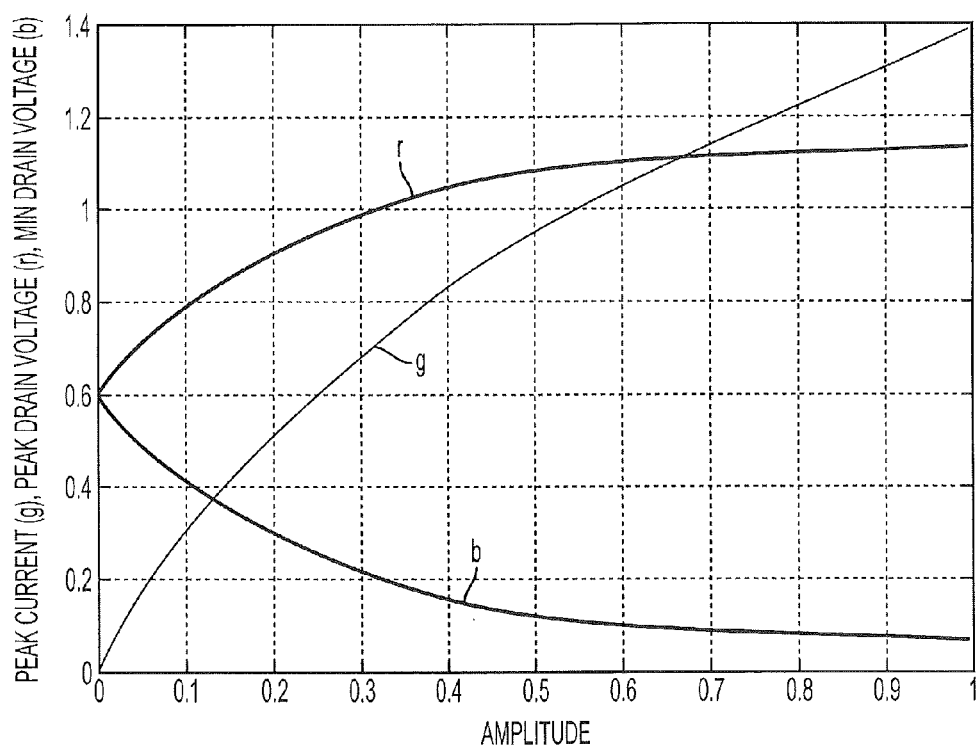
FIG. 11 is a graph that shows maximum and minimum voltages of an amplifier according to an exemplary embodiment.

According to one exemplary embodiment, by setting the resistor $R_{Term}$ to a value substantially equal to that of the load resistance (e.g., within 10% of the load resistance in the case of maximum (peak) output power) at harmonic frequencies, a voltage swing at harmonic overtones is reduced compared to those of the class F amplifier. Otherwise, the impedance produced by the resistor $R_{Term}$ may be larger, which may be beneficial for transistors in Doherty, Chireix, Load modulation amplifiers. Thus, the circuit of this exemplary embodiment may have strong harmonics in the current waveform without entering the breakdown or excessive saturation. These advantages of the exemplary embodiment are shown in FIGS. 10 and 11. FIG. 10 shows the current and voltage of an RF cycle of medium output amplitude with narrow current pulses (g). The voltage (r) overshoots and undershoots are reduced relative to the class F amplifier of FIG. 6, and the current pulse height is less compressed than in the class F amplifier of FIG. 6. FIG. 11 shows that the maximum and minimum drain voltages versus the amplitude and no output amplitudes have higher or lower voltage than the maximum output.

As shown in FIGS. 9-11, the voltage outside the current pulse, which is not self-regulated by the saturation (I-V) behaviour of the transistor, may be made less than that inside this region by having the impedance at the harmonics relatively close in magnitude to the load impedance. The practical maximum (the point at which the overshoots rise above the voltage swing at maximum output) for this impedance, as seen by the transistor output node, depends on the shape of the current pulse. For ordinary PMW current pulses the practical maximum is low, e.g., in the order of a few times the load (again as seen by the transistor output node), while for dynamic gate biasing (class C) the practical maximum may be considerably higher. This is due to the difference between the sharp pulse edges (fast rise/fall times) of PWM current pulses and the gentler slopes of class C current pulses (which are controlled by the topmost part of the (usually) sinusoidal RF drive signal). For example, softer current pulses (less deep class C) may tolerate higher impedance than the sharp-cornered PWM pulses. For PWM, a value of about 4 times the load resistance is the highest before the overshoots, at some output level, become higher than the voltage at maximum output. For an examined class C (through DCB) case, it was observed that a value of up to 8 times may be used (with less robustness and output power capability). Higher values for the harmonic termination resistance shift downwards the "breakpoint," below which the class C operation gives an increased efficiency. For most multi-carrier signal amplitude distributions, this means that the average efficiency also goes down.

Figure 12:
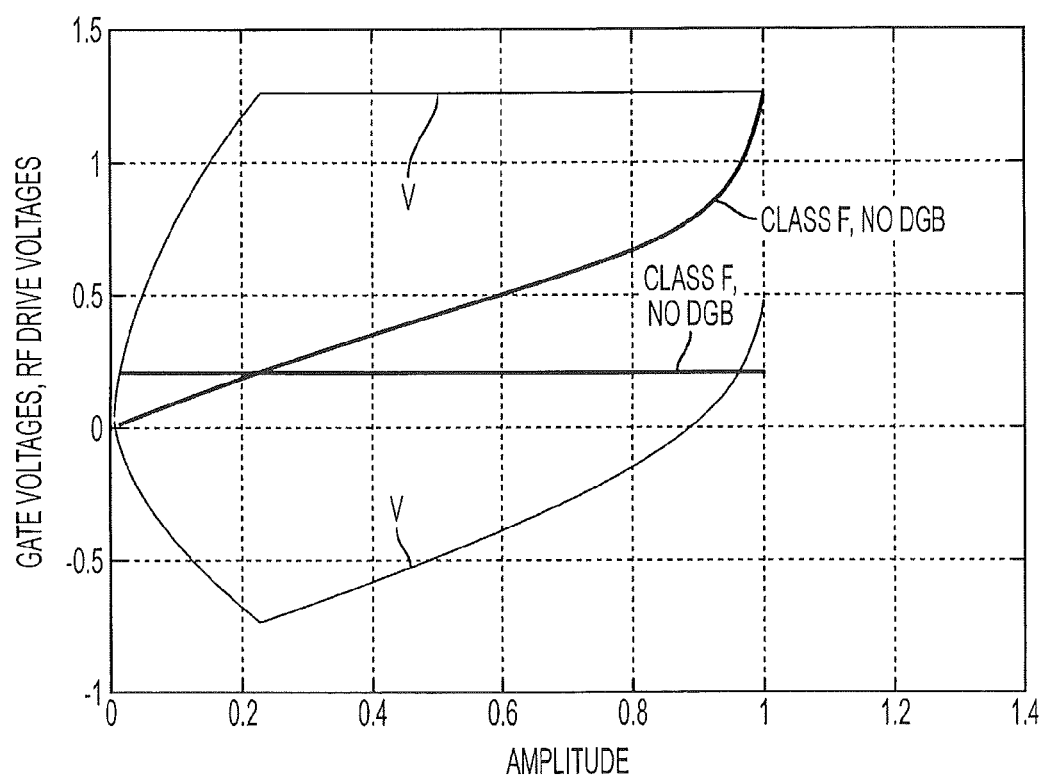
FIG. 12 is a graph showing a dynamic gate bias and RF drive voltage for an amplifier according to an exemplary embodiment and for a class F amplifier.

The dynamic gate bias and RF drive voltages "V," according to an exemplary embodiment, are shown in FIG. 12 and these voltages correspond to a termination resistance $R_{term}$ twice the load resistance. The corresponding voltages for a conventional class F amplifier are also shown in FIG. 12 for reference. In FIG. 12 the upper line corresponds to the RF drive voltage and the lower line corresponds to the gate bias voltage. According to an exemplary embodiment, the gate bias can be dynamic (variable), contrary to the conventional amplifiers for which the gate bias is constant, i.e., fixed.

Figure 13:
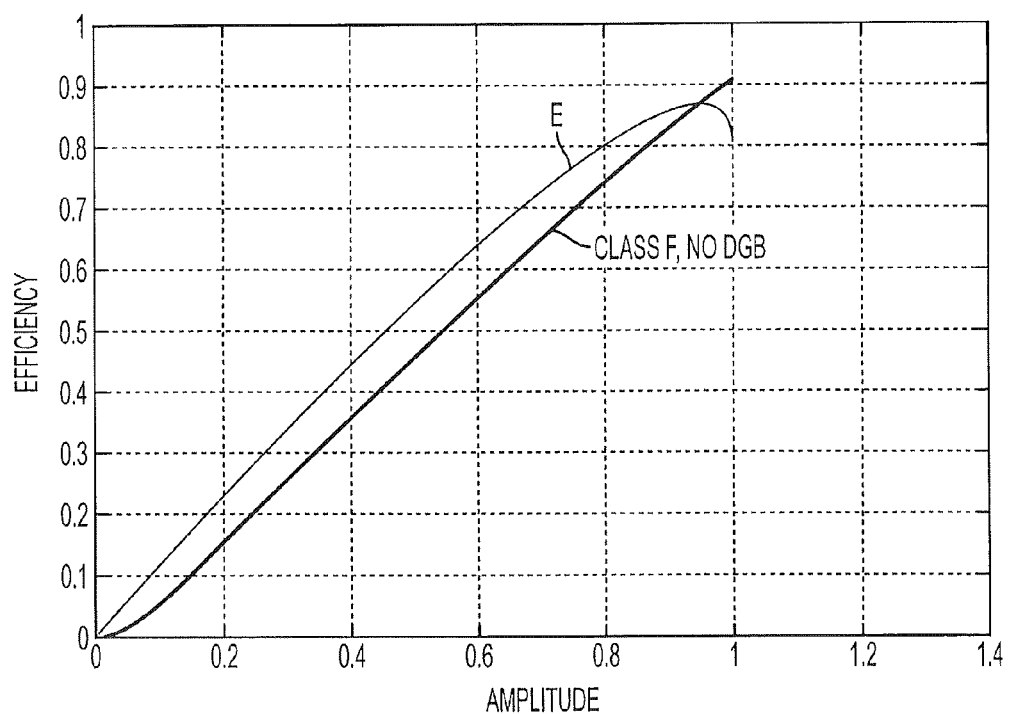
FIG. 13 is a graph showing an efficiency of the amplifier according to the exemplary embodiment and the class F amplifier.

The (drain) efficiency "E" versus the output amplitude of one exemplary embodiment is shown in FIG. 13, together with the efficiency of the conventional class F amplifier. FIG. 13 shows that the efficiency at low and medium amplitudes is higher for the exemplary embodiment than for the class F amplifier. For the highest amplitudes, the efficiency of the exemplary embodiment is lower than for the conventional class F amplifier. However, most of the signal amplitude distributions encountered in multicarrier and multi-user radio transmitters have the highest density at medium amplitudes, for which the amplifier of the exemplary embodiment is superior to the conventional amplifier, and thus, a better choice.

A high RF drive voltage might be a disadvantage if the gain of the transistor is low, in which case the drain efficiency of the transistor may be traded against a low drive signal power. This drawback may be reduced by driving the gate directly with a PWM-like waveform. Thus, in one exemplary embodiment, the gate of the transistor is driven with the PWM-like waveform.

Figure 14A:
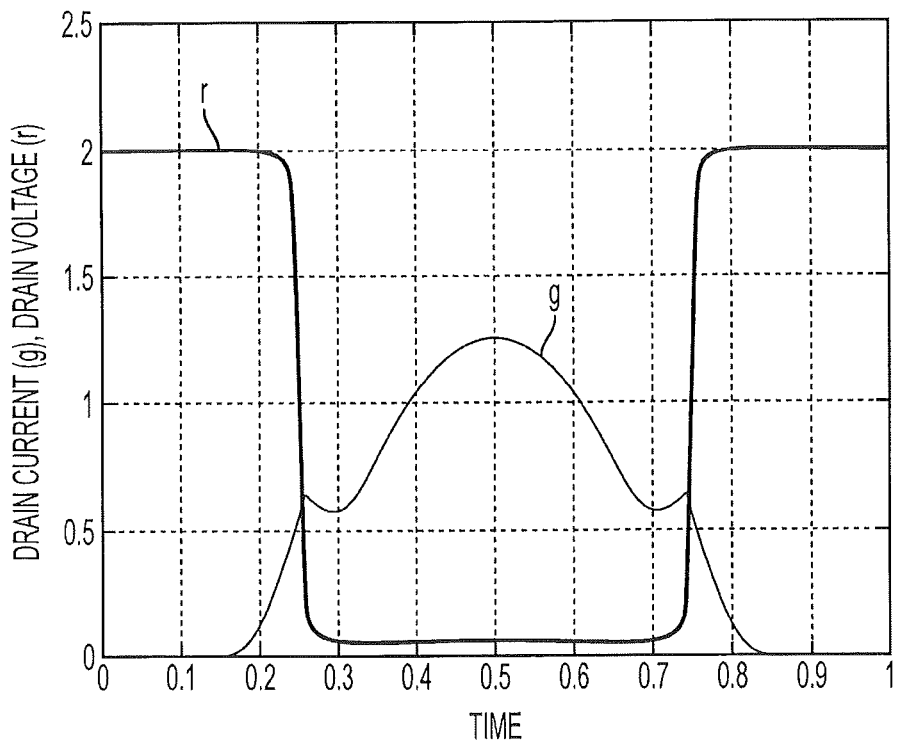
FIG. 14A is a graph showing the current and voltage of the class F amplifier and FIG. 14B is a graph showing the current and voltage of an amplifier according to an exemplary embodiment when $R_{Term}$ is equal to $R_{Load}$.
Figure 14B:
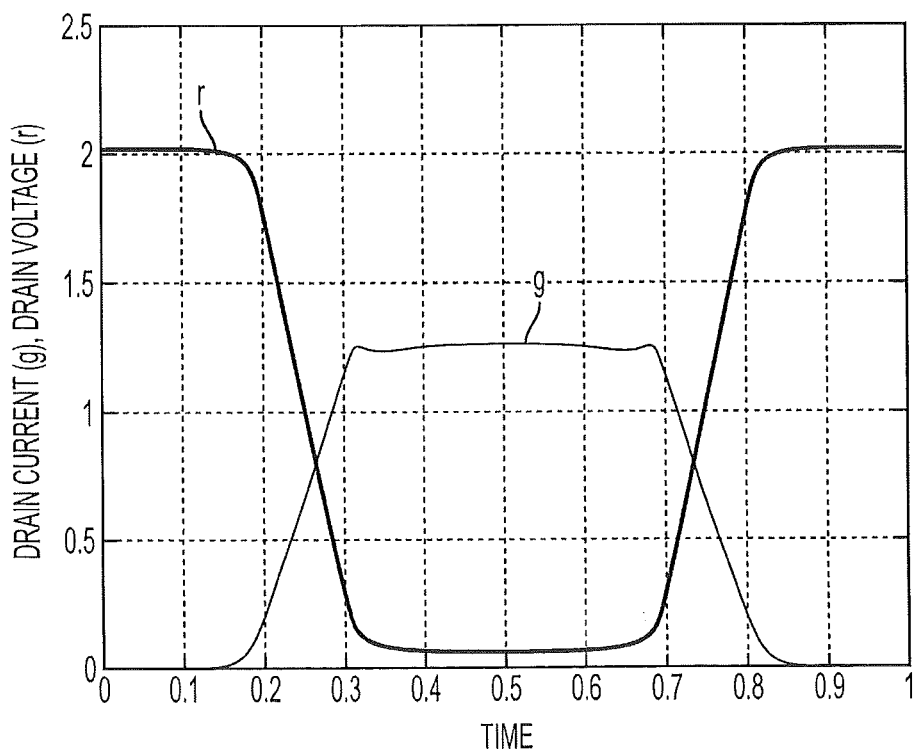

Another advantage of one of the exemplary embodiments is that an output power may be higher than for a conventional class F amplifier. The higher output power is achieved by the exemplary embodiment because the conventional class F amplifier has a peaky current waveform at the highest output amplitudes, whereas the exemplary embodiment has a flatter shaped current waveform. This shape of the current waveform is shown in FIGS. 14A and B. FIG. 14B shows the current waveform (g) of the conventional class F amplifier at its peak output power while FIG. 14B shows the current waveform (g) of an exemplary embodiment in which $R_{Term}$ is substantially equal to $R_{Load}$, at its peak output power. For the same peak current, the flatter current pulse of the exemplary embodiment contains more energy at the fundamental frequency. This flatter shape of the peak current more than compensates for the less square voltage waveform, and thus the power output of the amplifier according to this exemplary embodiment is higher than the power output of the conventional class F amplifier.

Figure 15:
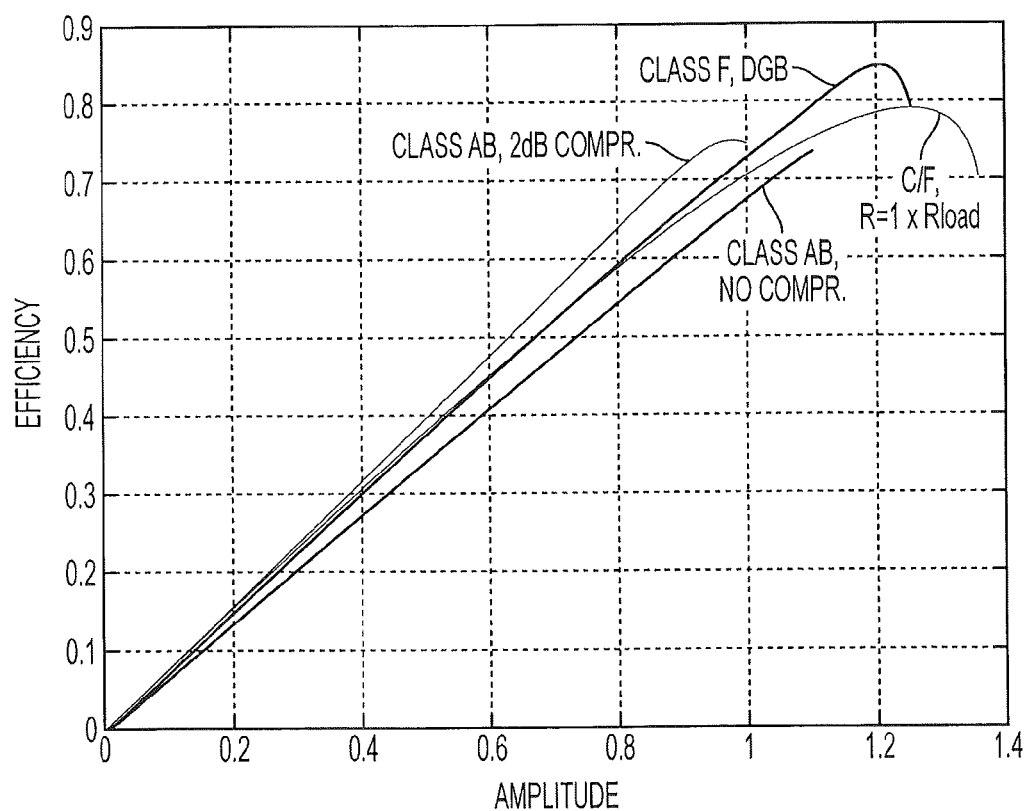
FIG. 15 is a graph comparing the efficiency of an amplifier according to an exemplary embodiment with the efficiency of a class AB and a class F amplifier.

The maximum output power of an amplifier (C/F) according to one exemplary embodiment is compared with conventional class AB and class F amplifiers, as shown in FIG. 15. In this figure, the peak RF drive voltages, peak drain voltages, and peak drain currents were designed (by properly setting the supply voltage and load resistance) to be the same for all four amplifiers. The same transistor was used for all four amplifiers. The class F amplifier is complemented in this example with a dynamic gate bias (DGB), which results in an increased output power above its point of maximum efficiency due to the increased gate bias voltage.

FIG. 15 shows the efficiency curves for the above discussed amplifiers having the maximum output potential. A conventional class AB amplifier with 2 dB compression at maximum output was chosen as a reference. Another conventional class AB amplifier, with almost no compression, is shown as reference of the maximum output for a non-DGB, non-class F amplifier. The amplifier of the exemplary embodiment (C/F, R=1×Rload) has the highest output power. Thus, the novel amplifier behaves like a hybrid amplifier, i.e., an amplifier having features from both class F and class C. With this "equal peak" amplifier dimensioning and sizing of drive signals, the class F amplifier is seen to have 1.1 dB higher output power than the reference class AB system ("no compression"), and the amplifier of the exemplary embodiment has a further 0.6 dB higher output power than the class F amplifier. In one exemplary embodiment, an inverse class C/F amplifier is considered. In this exemplary embodiment, the even harmonics are terminated in an impedance that is close in size to the load. According to an exemplary embodiment, a method for operating one of the above discussed power amplifiers is presented next. The method includes a step 160 of generating impedances at harmonic frequencies such that the power amplifier operates in a class C mode in a low output amplitude range and in a class F or inverse class F mode in a high output amplitude range. The harmonics in this step may be odd or even harmonics.

Dynamic gate bias (DGB), Pulse Width Modulation (PWM), or some other method that determines a variable RF current pulsewidth, may be used with the novel amplifier. Controlling one or more overtones in the input signal in one exemplary embodiment, may be beneficial in the dynamic gate bias case. The exemplary amplifiers discussed above may be applied to Doherty, Chireix, Load Modulation (LM), Dynamic Drain Bias (DDB), and Envelope Elimination and Restoration (EER) amplifiers. In many of these systems, the harmonic termination impedance preferably lies in the upper size range, because these amplifiers have a relatively large portion of their operation with a high voltage swing relative to the supply voltage. In the case of a Doherty, Chireix, or LM amplifier, there may be a trade off between the efficiency in the upper region of the high voltage swing operation and the efficiency at amplitudes below this region.

As discussed above, one or more of the exemplary amplifiers discussed above have a higher output power than a conventional class F amplifier, for equal transistors and equal limitations, under both PWM drive and most DGB+sinusoidal RF drive conditions. In addition, the exemplary amplifiers are more robust than the conventional class F amplifiers because the relatively low impedance termination of harmonics reduces the inadvertent transient voltages, and narrow current pulses due to fast changes in the signal, start up processes, etc. Further, the exemplary amplifiers are also more broadband than a conventional class F amplifier, since the Q values of the harmonic resonators are lower.

Another advantage of one or more exemplary embodiments is that a higher average efficiency may be obtained. The higher efficiency may be obtained in single transistor amplifiers, Doherty, Chireix, LM, DDB, and EER systems as well as most other composite amplifiers. Thus, the exemplary amplifiers have a higher average efficiency, are more robust, are more broadband, and have a higher output power than conventional amplifiers.

The disclosed exemplary embodiments provide a device, a system, and a method for amplifying a signal. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

As also will be appreciated by one skilled in the art, the exemplary embodiments may be embodied in a base station of a telecommunication network, a mobile terminal as a phone, PDA, or any communication device capable of amplifying signals.

What is claimed is:

1. A power amplifier comprising at least one component configured to generate impedances at one or more harmonic frequencies such that the power amplifier operates in a class C mode in a low output amplitude range and in a class F or inverse class F mode in a high output amplitude range,
    wherein the impedances are configured to reduce a voltage swing at the one or more harmonic frequencies.

2. The power amplifier of claim 1, wherein the harmonic frequencies are odd harmonic frequencies.

3. The power amplifier of claim 1, wherein the harmonic frequencies are even harmonic frequencies.

4. The power amplifier of claim 1, wherein the class C mode is defined by having narrow output current pulses at a transistor of the power amplifier.

5. The power amplifier of claim 1, wherein the class F mode is defined by having a square-shaped output voltage waveform at a transistor of the power amplifier.

6. The power amplifier of claim 1, wherein the inverse class F mode is defined by having a square-shaped output current waveform at a transistor of the power amplifier.

7. The power amplifier of claim 1, wherein the impedances include a finite impedance at one or more harmonics of a fundamental frequency, and wherein the finite impedance reduces an impedance that is seen by a transistor of the power amplifier at the harmonics due to one or more resonators in parallel and/or in series with a load.

8. The power amplifier of claim 7, wherein the harmonics are odd harmonics.

9. The power amplifier of claim 7, wherein the harmonics are even harmonics.

10. The power amplifier of claim 1, wherein the power amplifier comprises:
a transistor configured to generate an output; and
an output circuit connected to the transistor to receive the output and including the impedances.

11. The power amplifier of claim 10, wherein the output circuit comprises:
a circuit blocking a fundamental frequency, in series with an impedance, connected between an emitter and a collector of the transistor or between a source and a drain of the transistor.

12. The power amplifier of claim 11, wherein the output circuit comprises:
a first serial resonator resonating at twice the fundamental frequency and connected in parallel with a capacitor between the emitter and the collector or between the source and the drain of the transistor.

13. The power amplifier of claim 11, wherein the circuit blocking the fundamental frequency is a parallel resonator.

14. The power amplifier of claim 11, wherein the impedance is mainly resistive at one or several harmonics.

15. The power amplifier of claim 11, wherein a value of the impedance is approximately equal to a value of a load resistance for odd harmonics.

16. The power amplifier of claim 13, wherein the parallel resonator is configured to block the fundamental frequency.

17. The power amplifier of claim 10, wherein a gate voltage of the transistor comprises a dynamic gate bias voltage.

18. The power amplifier of claim 10, wherein a gate voltage of the transistor is a pulse width modulated waveform.

19. A method for using a power amplifier, comprising:
generating impedances at one or more harmonic frequencies such that the power amplifier operates in a class C mode in a low output amplitude range and in a class F or inverse class F mode in a high output amplitude rang;
wherein the impedances are configured to reduce a voltage swing at the one or more harmonic frequencies.

20. The method of claim 19, wherein the harmonic frequencies are odd harmonic frequencies.

21. The method of claim 19, wherein the harmonic frequencies are even harmonic frequencies.

22. The method of claim 19, further comprising:
achieving the class C mode by having narrow output current pulses at a transistor of the power amplifier.

23. The method of claim 19, further comprising:
achieving the class F mode by having a square-shaped output voltage waveform at a transistor of the power amplifier.

24. The method of claim 19, further comprising:
achieving the inverse class F mode by having a square-shaped output voltage waveform at a transistor of the power amplifier.

25. A radio transmitter, comprising:
a power amplifier comprising at least one component configured to generate impedances at one or more harmonic frequencies such that the power amplifier operates in a class C mode in a low output amplitude range and in a class F or inverse class F mode in a high output amplitude range, wherein the impedances are configured to reduce a voltage swing at the one or more harmonic frequencies.

* * * * *

UNITED STATES PATENT AND TRADEMARK OFFICE
CERTIFICATE OF CORRECTION

Page 1 of 1

PATENT NO. : 8,593,225 B2
APPLICATION NO. : 13/712513
DATED : November 26, 2013
INVENTOR(S) : Hellberg It is certified that error appears in the above-identified patent and that said Letters Patent is hereby corrected as shown below:

In the Specification:

In Column 7, Line 41, delete "transistor 10" and insert -- transistor 12 --, therefor.

In Column 8, Line 38, delete "DCB)" and insert -- DGB) --, therefor.

In the Claims:

In Column 12, Line 11, in Claim 19, delete "rang;" and insert -- range, --, therefor.

Signed and Sealed this
Eighth Day of July, 2014

Michelle K. Lee
*Deputy Director of the United States Patent and Trademark Office*